(12) United States Patent
Choi et al.

(10) Patent No.: US 9,293,177 B2
(45) Date of Patent: Mar. 22, 2016

(54) SEMICONDUCTOR MEMORY DEVICE, MEMORY SYSTEM INCLUDING THE SAME AND OPERATING METHOD THEREOF

(71) Applicant: SK hynix Inc., Gyeonggi-do (KR)

(72) Inventors: Seok Hwan Choi, Gyeonggi-do (KR); Hyun Ju Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 14/184,279

(22) Filed: Feb. 19, 2014

(65) Prior Publication Data

US 2015/0117125 A1 Apr. 30, 2015

(30) Foreign Application Priority Data

Oct. 28, 2013 (KR) .......... 10-2013-0128490

(51) Int. Cl.
| | |
|---|---|
| *G11C 7/02* | (2006.01) |
| *G11C 29/02* | (2006.01) |
| *G11C 29/42* | (2006.01) |
| *G11C 7/10* | (2006.01) |

(52) U.S. Cl.
CPC .............. *G11C 7/02* (2013.01); *G11C 29/021* (2013.01); *G11C 29/028* (2013.01); *G11C 29/42* (2013.01); *G11C 7/1006* (2013.01); *G11C 29/026* (2013.01)

(58) Field of Classification Search
CPC ........ G11C 11/00; G11C 7/00; G11C 29/021; G11C 7/02; G11C 29/028

USPC .......... 365/148, 163, 189.16, 189.15
See application file for complete search history.

(56) References Cited

U.S. PATENT DOCUMENTS

| | | | |
|---|---|---|---|
| 7,057,937 B1 * | 6/2006 | Matsubara et al. | ...... 365/185.24 |
| 2004/0004862 A1 * | 1/2004 | Sumitani | .......... 365/189.05 |
| 2009/0113259 A1 * | 4/2009 | Aritome | ................ 714/721 |
| 2010/0027326 A1 * | 2/2010 | Kim et al. | ............... 365/163 |
| 2010/0229001 A1 * | 9/2010 | Park et al. | ............... 713/190 |
| 2011/0149652 A1 * | 6/2011 | Lee | ............. G11C 11/5628 |
| | | | 365/185.11 |
| 2013/0343125 A1 * | 12/2013 | Gillingham et al. | ..... 365/185.03 |
| 2014/0293675 A1 * | 10/2014 | Kanno | ........... G11C 13/0035 |
| | | | 365/148 |

FOREIGN PATENT DOCUMENTS

| | | |
|---|---|---|
| KR | 1020100101896 | 9/2010 |
| KR | 1020130046190 | 5/2013 |

* cited by examiner

*Primary Examiner* — Huan Hoang
*Assistant Examiner* — Muna A Techane
(74) *Attorney, Agent, or Firm* — IP & T Group LLP (57) ABSTRACT

Provided are a semiconductor memory device, a memory system including the same, and an operating method thereof. The semiconductor memory device includes a memory cell array including a plurality of memory cells, a peripheral circuit suitable for reading least significant bit data and most significant bit data of neighboring memory cells adjacent to selected memory cells out of the plurality of memory cells, and generating pattern flag data using the least significant bit data and the most significant bit data and a control logic suitable for controlling the peripheral circuit to set a read voltage to be applied to the selected memory cells based on the pattern flag data.

16 Claims, 8 Drawing Sheets

SEMICONDUCTOR MEMORY DEVICE, MEMORY SYSTEM INCLUDING THE SAME AND OPERATING METHOD THEREOF

CROSS-REFERENCE TO RELATED APPLICATION

The present application claims priority to Korean patent application number 10-2013-0128490 filed on Oct. 28, 2013, in the Korean Intellectual Property Office, the entire disclosure of which is incorporated by reference herein.

BACKGROUND

1. Technical Field

Various embodiments of the present invention relate to a semiconductor memory device, a memory system including the same, and an operating method thereof.

2. Related Art

A semiconductor memory device implemented with a semiconductor such as silicon (Si), germanium (Ge), gallium arsenide (GaAs), or indium phosphide (InP). The semiconductor memory device can be broadly classified into volatile or non-volatile memory device.

Data stored in a volatile memory device is lost when power supply is cut off. Examples of the volatile memory device may include a static random access memory (SRAM), a dynamic RAM (DRAM), a synchronous DRAM (SDRAM) and the like. Examples of the non-volatile memory device may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory can be broadly classified into NOR type or NAND type.

SUMMARY

Various embodiments of the present invention are directed to a semiconductor memory device, a memory system including the same, and an operating method thereof that may precisely read out data.

One aspect of the present invention provides a semiconductor memory including a memory cell array including a plurality of memory cells, a peripheral circuit suitable for reading least significant bit data and most significant bit data of neighboring memory cells adjacent to selected memory cells out of the plurality of memory cells, and generating pattern flag data using the least significant bit data and the most significant bit data, and a control logic suitable for controlling the peripheral circuit to set a read voltage to be applied to the selected memory cells based on the pattern flag data.

Another aspect of the present invention provides a memory system including a semiconductor memory device suitable for reading stored data, and a controller suitable for receiving a command from a host to control a read operation of the semiconductor memory device, wherein, during the read operation, the semiconductor memory device generates pattern flag data based on least significant bit data and most significant bit data of neighboring memory cells adjacent to selected memory cells, and transmits the pattern flag data to the controller.

Still another aspect of the present invention provides a method of operating a semiconductor memory device including reading least significant bit data and most significant bit data of neighboring memory cells that are adjacent to a selected memory cell, generating pattern flag data using the least significant bit data and the most significant bit data, setting a read voltage based on the pattern flag data, and reading data stored in the selected memory cells using the read voltage.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

The advantages and features of the present invention and methods of achieving them will be described using embodiments of the present invention to be described in detail hereinafter with reference to the accompanying drawings. The present invention may, however, be embodied in different forms and should not be construed as limited to the embodiments set forth herein. That is, the embodiments of the present invention are provided to give a description sufficient to allow those with ordinary skill in the art to implement technical aspects of the present invention with ease.

In the entire specification, when it is said that any part "is connected" to a different part, this includes cases in which it is "indirectly connected" with another element placed therebetween. In the entire specification, when it is said that any part "includes" any component, unless specifically stated otherwise, this does not preclude any additional different configuration elements from being included.

Figure 1:
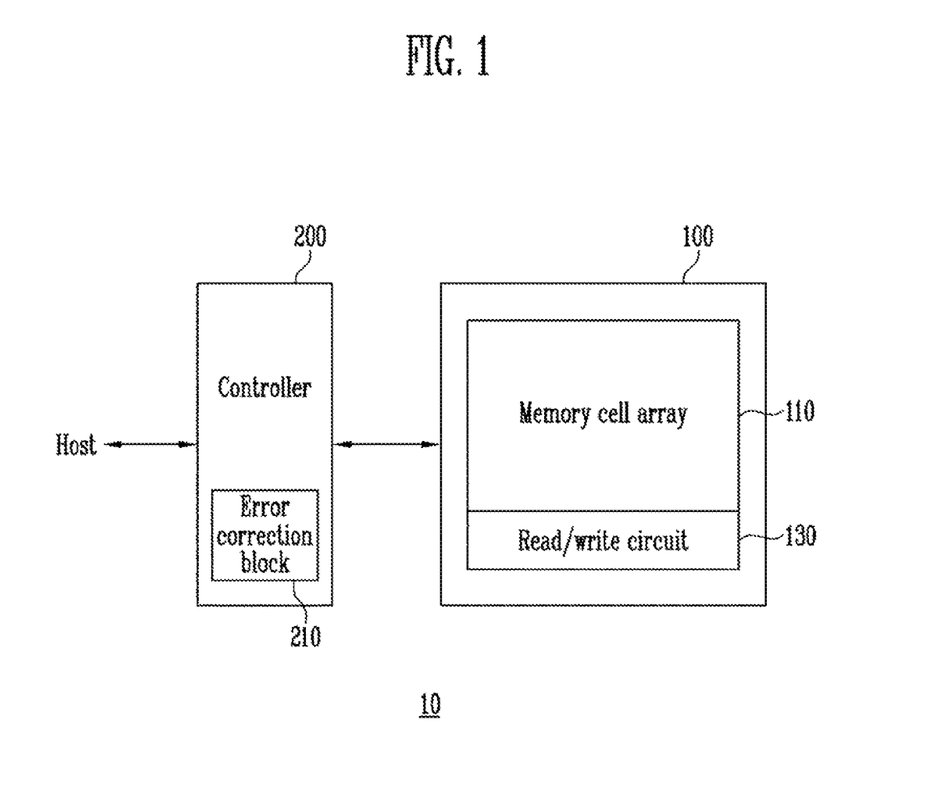
FIG. 1 is a block diagram illustrating a memory system including a semiconductor memory device according to an embodiment of the present invention.

FIG. 1 is a block diagram illustrating a memory system 10 including a semiconductor memory device 100 according to an embodiment of the present invention.

Referring to FIG. 1, the memory system 10 may include the semiconductor memory device 100 and a controller 200. The semiconductor memory device 100 may include a memory cell array 110, and a read/write circuit 130 connected to the memory cell array 110.

The memory cell array 110 may include a plurality of memory cells. The memory cell may be a multi-level memory cell that stores two or more bits of data.

The semiconductor memory device 100 may operate under control of the controller 200. The semiconductor memory device 100 may perform a read operation on selected memory cells indicated by an address received along with a program command or erase command from the controller 200. In this case, the semiconductor memory device 100 may read data stored in neighboring memory cells adjacent to the selected memory cells during the read operation, generate pattern flag data based on the data read from the neighboring memory cells and transmit the pattern flag data to the controller 200. Here, the neighboring memory cell may be adjacent to the selected memory cell in a direction of a word line and may be programmed after the selected memory cell during the program operation. The semiconductor memory device 100 may perform XOR or XNOR operation on most significant bit (MSB) data and least significant bit (LSB) data stored in the neighboring memory cells to generate the pattern flag data, and transmit the generated pattern flag data to the controller 200, so that the amount of data to be transmitted to the controller 200 may be reduced.

Here, as an embodiment of the present invention, the semiconductor memory device 100 may be a flash memory device. However, the technical aspects of the present invention are not limited to a flash memory device.

The controller 200 may be connected between the semiconductor memory device 100 and the host. The controller 200 may interface between the host and the semiconductor memory device 100. For example, when read or program operation is performed in response to a request from the host, the controller 200 may convert a logical block address received from the host into a physical block address, and provide the semiconductor memory device 100 with the converted physical block address and a corresponding command. In addition, when the read operation is performed, the controller 200 may analyze the pattern flag data received from the semiconductor memory device 100 to determine an interference amount that the selected memory cells may experience from the neighboring memory cells. Thus, based on the pattern flag data generated through the MSB and LSB data stored in the neighboring memory cells, the controller 200 may control the semiconductor memory device 100 to set a read voltage for the selected memory cell of the semiconductor memory device 100.

As an embodiment, the controller 200 may include an error correction block 210. The error correction block 210 may detect and correct errors of data received from the semiconductor memory device 100. An error correction function performed by the error correction block 210 may depend on a number of error bits out of data received from the semiconductor memory device 100. The error correction block 210 may perform the error detection and correction functions as long as the number of error bits out of data received from the semiconductor memory device 100 is less than a specific value. When the number of error bits out of data received from the semiconductor memory device 100 is greater than the specific value, the controller 200 may control the semiconductor memory device 200 to adjust the read voltage for the selected memory cell.

Figure 2:
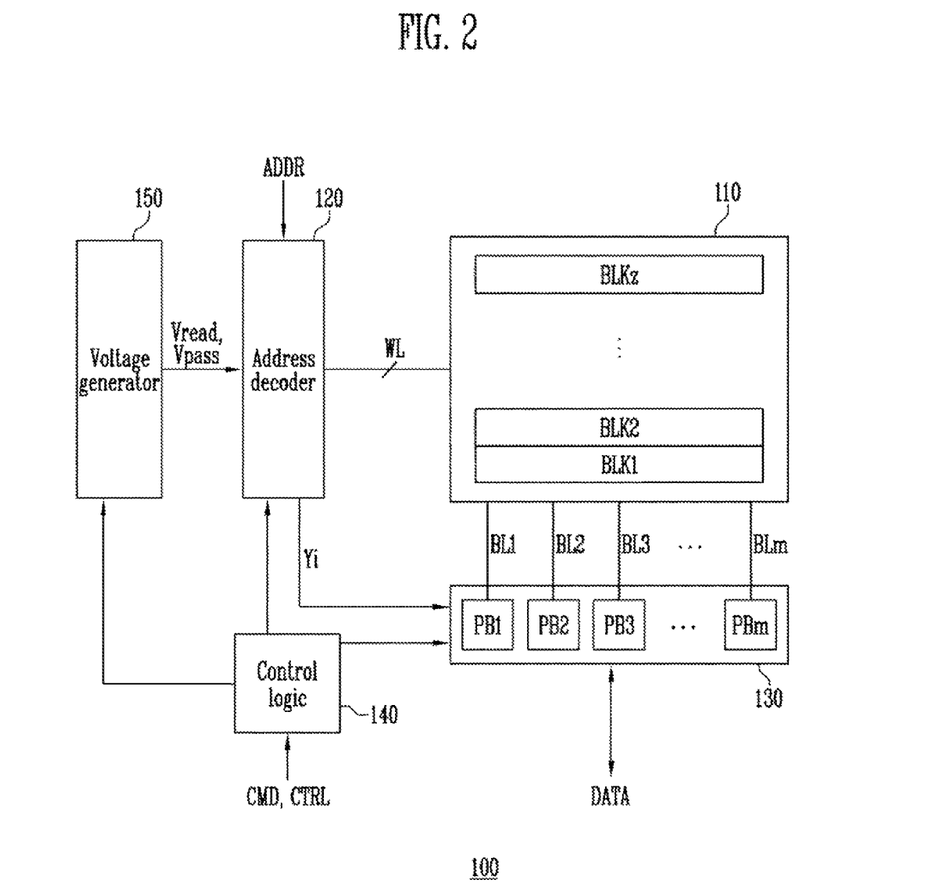
FIG. 2 is a block diagram illustrating the semiconductor memory device shown in FIG. 1.

FIG. 2 is a block diagram illustrating the semiconductor memory device 100 shown in FIG. 1.

Referring to FIG. 2, the semiconductor memory device 100 may include a memory cell array 110, an address decoder 120, a read/write circuit 130, a control logic 140, and a voltage generator 150.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read/write circuit 130 through bit lines BL1 to BLm. Each of the plurality of memory blocks BLK1 to BLKz may include a plurality of memory cells. As an embodiment, the plurality of memory cells may be non-volatile memory cells. Memory cells, which are connected to a word line of the plurality of memory cells, may be defined as a page. That is, the memory cell array 110 may include a plurality of pages.

The address decoder 120, the read/write circuit 130 and the voltage generator 150 may drive the memory cell array 110.

The address decoder 120 may be connected to the memory cell array 110 through the word lines WL. The address decoder 120 may operate under control of the control logic 140. The address decoder 120 may receive an address ADDR through an input/output buffer (not illustrated) in the semiconductor memory device 100. The address ADDR is provided from the controller 200.

During the read operation, the address decoder 120 may decode a row address out of received addresses ADDR, apply a read voltage Vread generated from the voltage generator 150 to a selected word line out of the plurality of word lines WL in response to the decoded row address, and apply a pass voltage Vpass to the remaining non-selected word lines.

The address decoder 120 may decode a column address out of the received addresses ADDR and transmit the decoded column address Yi to the read/write circuit 130.

In the semiconductor memory device 100, read and program operations are performed in page units. The addresses ADDR received during a read/write operation may include a block address, a row address and a column address. The address decoder 120 may select one memory block and one word line in response to the block address and the row address, respectively. The read/write circuit 130 may receive the column address, which is decoded by the address decoder 120.

The address decoder 120 may include a block decoder, a row decoder, a column decoder, an address buffer, and the like.

The read/write circuit 130 may include a plurality of page buffers PB1 to PBm. The plurality of page buffers PB1 to PBm may be connected to the memory cell array 110 through the bit lines BL1 to BLm. When the read operation is performed each of the plurality of page buffers PB1 to PBm may read and temporarily store MSB and LSB data of a neighboring page that is adjacent to the selected page out of the memory cell array 110, and generate the pattern flag data by performing a logical operation on the temporarily stored MSB and LSB data. In this case, the pattern flag data may be generated by performing XOR or XNOR operation on the MSB and LSB data. A detailed description of the logical operation on the MSB and LSB data to generate the pattern flag data will be described later. In addition, each of the plurality of page buffers PB1 to PBm may transmit the generated pattern flag data to the controller 200. Then, each of the plurality of page buffers PB1 to PBm may read and temporarily store the MSB and LSB data of the memory cells included in the selected page, and transmit the temporarily stored MSB and LSB data to the controller 200.

The read/write circuit 130 may operate under control of the control logic 140.

As an embodiment, the read/write circuit 130 may include page buffers or page registers, column selection circuits, and the like.

The control logic 140 may be connected to the address decoder 120, the read/write circuit 130, and the voltage generator 150. The control logic 140 may receive a command CMD though an input/output buffer (not illustrated) of the semiconductor memory device 100. The command CMD may be provided from the controller 200. The control logic 140 may control all the related operations of the semiconductor memory device 100 in response to the command CMD. In addition, when a read command and an interference cancellation algorithm command are input, the control logic 140 controls such that the read/write circuit 130 may read MSB and LSB data of the neighboring page adjacent to the selected page, and transmit the pattern flag data to the controller 200. The controller 200 may control the voltage generator 150 to adjust the read voltage Vread, which may be generated from the voltage generator 150, in response to a read voltage adjustment command CTRL received from the controller 200. In addition, when a read operation of the selected page using the adjusted read voltage Vread may be performed, the controller 200 may control such that the read write circuit 130 may read the MSB and LSB data of the neighboring page adjacent to the selected page, and transmit the pattern flag data to the controller 200.

When the read operation is performed, the voltage generator 150 may generate the read voltage Vread and the pass voltage Vpass. The voltage generator 150 may adjust a potential level of the read voltage Vread generated in response to control of the control logic 140 and output the adjusted voltages.

Figure 3:
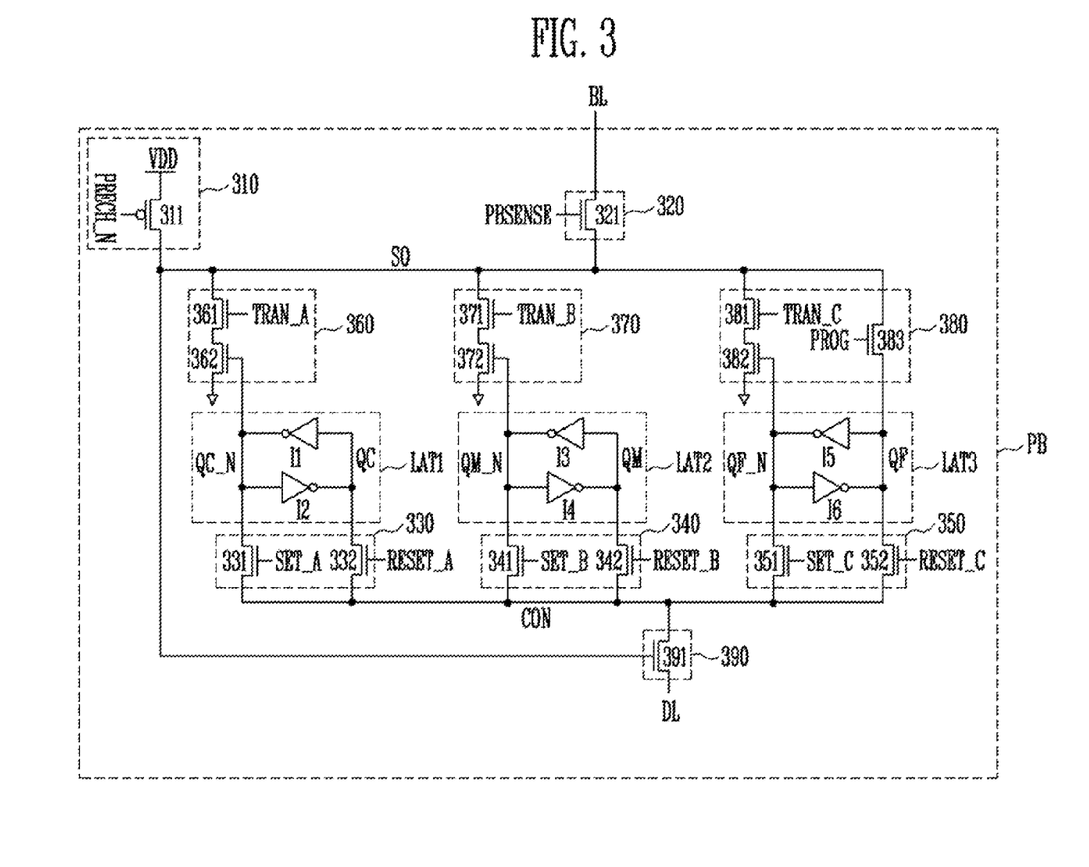
FIG. 3 is a circuit diagram illustrating a page buffer shown in FIG. 2.

FIG. 3 is a detailed circuit diagram illustrating the page buffer shown in FIG. 2.

A page buffer (PB) may include a precharge circuit 310, a sensing circuit 320, first to third latches LAT1, LAT2 and LAT3, first to third set/reset circuits 330, 340 and 350, first to third transmission circuits 360, 370 and 380, and a data output circuit 390.

The precharge circuit 310 may precharge a sensing node SO by connecting a power supply VDD to the sensing node SO in response to a precharge signal PRECH_N. The precharge circuit 310 may include a PMOS transistor 311 connected between the power supply VDD and the sensing node SO and operate in response to the precharge signal PRECH_N.

The sensing circuit 320 may connect a selected bit line BL and the sensing node SO in response to a sensing signal PBSENSE. The sensing circuit 320 may include an NMOS transistor 321 connected between the bit line BL and the sensing node SO and operate in response to the sensing signal PBSENSE.

The first latch LAT1 may include first and second inverters I1 and I2. An input terminal of the first inverter I1 and an output terminal of the second inverter I2 may be connected to each other, and an output terminal of the first inverter I1 and an input terminal of the second inverter I2 may be connected to each other. The input terminal of the first inverter I1 is referred to as a cache node QC, and the output terminal of the first inverter I1 is referred to as a reverse cache node QC_N.

The second latch LAT2 may include third and fourth inverters I3 and I4. An input terminal of the third inverter I3 and an output terminal of the fourth inverter I4 may be connected to each other, and an output terminal of the third inverter I3 and an input terminal of the fourth inverter I4 may be connected to each other. The input terminal of the third inverter I3 is referred to as a main node QM, and the output terminal of the third inverter I3 is referred to as a reverse main node QM_N.

The third latch LAT3 may include fifth and sixth inverters I5 and I6. An input terminal of the fifth inverter I5 and an output terminal of the sixth inverter I6 may be connected to each other, and an output terminal of the fifth inverter I5 and an input terminal of the sixth inverter I6 may be connected to each other. The input terminal of the fifth inverter I5 is referred to as a flag node QF, and the output terminal of the fifth inverter I5 is referred to as a reverse flag node QF_N.

The first set/reset circuit 330 may transmit data of the first latch LAT1 to a common node CON in response to a first set signal SET_A and a first reset signal RESET_A. The first set/reset circuit 330 may include an NMOS transistor 331, which may operate in response to the first set signal SET_A and connect the reverse cache node QC_N and the common node CON, and an NMOS transistor 332, which may operate in response to the first reset signal RESET_A and connect the cache node QC and the common node CON.

The second set/reset circuit 340 may transmit data of the second latch LAT2 to the common node CON in response to a second set signal SET_B and a second reset signal RESET_B. The second set/reset circuit 340 may include an NMOS transistor 341, which may operate in response to the second set signal SET_B and connect the reverse main node QM_N and the common node CON, and an NMOS transistor 342, which may operate in response to the second reset signal RESET_B and connect the cache node QM and the common node CON.

The third set/reset circuit 350 may transmit data of the third latch LAT3 to the common node CON in response to a third set signal SET_C and a third reset signal RESET_C. The third set/reset circuit 350 may include an NMOS transistor 351, which may operate in response to the third set signal SET_C and connect the reverse main node QF_N and the common node CON, and an NMOS transistor 352, which may operate in response to the third reset signal RESET_C and connect the flag node QF and the common node CON.

The first transmission circuit 360 may maintain a potential of the sensing node SO or discharge the sensing node SO in response to the data stored in the first latch LAT1. The first transmission circuit 360 may include a first switch 361 and a second switch 362 connected in series between the sensing node SO and a ground voltage Vss. The first switch 361 may include an NMOS transistor, which may operate in response to the first transmission signal TRAN_A and connect the sensing node SO to the second switch 362. The second switch 362 may include an NMOS transistor, which may operate in response to the data of the reverse cache node QC_N and connect the first switch 361 to the ground voltage Vss.

The second transmission circuit 370 may maintain the potential of the sensing node SO or discharge the sensing node SO in response to the data stored in the first latch LAT2. The second transmission circuit 370 may include a third switch 371 and a fourth switch 372 connected in series between the sensing node SO and the ground voltage Vss. The third switch 371 may include an NMOS transistor, which may operate in response to the second transmission signal TRAN_B and connect the sensing node SO to the fourth switch 372. The fourth switch 372 may include an NMOS transistor, which may operate in response to the data of the reverse main node QM_N and connect the third switch 371 to the ground voltage Vss.

The third transmission circuit 380 may maintain the potential of the sensing node SO or discharge the sensing node SO in response to the data stored in the third latch LAT3. The third transmission circuit 380 may include a fifth switch 381 and a sixth switch 382, which may be connected in series between the sensing node SO and the ground voltage Vss, and a seventh switch 383 connected between the sensing node SO and the third latch LAT3. The fifth switch 381 may include an NMOS transistor, which may operate in response to the third transmission signal TRAN_C and connect the sensing node SO to the sixth switch 382. The sixth switch 382 may include an NMOS transistor, which may operate in response to the data of the reverse flag node QF_N, and connect the fifth switch 381 to the ground voltage Vss. The seventh switch 383 may include an NMOS transistor 383, which may operate in response to an eighth transmission signal PROD and connect the sensing node SO to the flag node QF.

The data output circuit 390 may connect a data line DL to the common node CON in accordance with the potential of the sensing node SO, and output the data transmitted to the common node CON to the data line DL.

A method of generating the pattern flag data using the MSB and LSB data of the neighboring page adjacent to the selected page is described as follows with reference to FIG. 3.

The page buffer PB may sense the LSB data of the neighboring page adjacent to the selected page connected through the bit line BL and temporarily store the sensed LSB data in the first latch LAT1 of the page buffer PB.

TABLE 1

|  | LSB | MSB | QC (LAT1) | QM (LAT2) | QF (LAT3) |
|---|---|---|---|---|---|
| Case 1 | 0 | — | 0 | — | — |
| Case 2 | 1 | — | 1 | — | — |

Referring to Table 1, in case 1 where the LSB data is read as "0" and stored in the first latch LAT1, the cache node QC becomes "0." Alternatively, in case 2 where the LSB data is read as "1" and stored in the first latch LAT1, the cache node QC becomes "1." In these cases, when the data is "0," a potential of the corresponding node may be "Vcc," and when the data is "1," the potential of the corresponding node may be "0 V."

TABLE 2

|  | LSB | MSB | QC (LAT1) | QM (LAT2) | QF (LAT3) |
|---|---|---|---|---|---|
| Case 1 | 0 | — | 0 | 0 | 1 |
| Case 2 | 1 | — | 1 | 1 | 0 |

Referring to Table 2, by activating the first rest signal RESET_A, the second reset signal RESET_B, and the third reset signal RESET_C, the LSB data stored in the first latch LAT1 may be stored in the second latch LAT2, while inversion of the LSB data stored in the first latch LAT1 may be stored in the third latch LAT3. Accordingly, in case 1 where the LSB data is "0", "0" may be stored in the cache node QC and the main node QM, and "1" may be stored in the flag node QF. In case 2 where the LSB data is "1", "1" may be stored in the cache node QC and the main node QM, and "0" may be stored in the flag node QF.

The page buffer PB may sense the MSB data of the neighboring page adjacent to the selected page connected through the bit line BL and temporarily store the MSB data in the first latch LAT1 of the page buffer PB.

TABLE 3

|  | LSB | MSB | QC (LAT1) | QM (LAT2) | QF (LAT3) |
|---|---|---|---|---|---|
| Case 1 | 0 | 0 | 1 | 0 | 1 |
|  |  | 1 | 0 | 0 | 1 |
| Case 2 | 1 | 0 | 1 | 1 | 0 |
|  |  | 1 | 0 | 1 | 0 |

Referring to Table 3, the MSB data may be read as "0" or "1" and temporarily stored in the first latch LAT1 in both of case 1 and case 2. The inversion of the MSB data may be temporarily stored in the first latch LAT1. That is, when the MSB data is read as "0", the cache node QC of the first latch LAT1 may become "1." When the MSB is read as "1", the cache node QC of the first latch LAT1 may become "0."

TABLE 4

|  | LSB | MSB | QC (LAT1) | QM (LAT2) | QF (LAT3) | SO |
|---|---|---|---|---|---|---|
| Case 1 | 0 | 0 | 1 | 0 | 1 | 1 |
|  |  | 1 | 0 | 0 | 1 | 0 |
| Case 2 | 1 | 0 | 1 | 1 | 0 | 1 |
|  |  | 1 | 0 | 1 | 0 | 0 |

Referring to Table 4, by activating the precharge signal PRECH_N, the sensing node SO may be precharged, and then the precharge signal PRECH_N may be deactivated. By activating the first transmission signal TRAN_A, a potential of the sensing node SO may be varied in response to the MSB data stored in the first latch LAT1. That is, if the MSB data is "0," the second switch 362 may be turned off, so that the sensing node SO may maintain a high level when the first transmission signal TRAN_A is activated. If the MSB is "1," the second switch 362 may be turned on, and thus a potential of the sensing node SO may be changed to a lour level when the first transmission signal TRAN_A is activated.

TABLE 5

|  | LSB | MSB | QC (LAT1) | QM (LAT2) | QF (LAT3) | SO |
|---|---|---|---|---|---|---|
| Case 1 | 0 | 0 | 1 | 0 | 0 | 1 |
|  |  | 1 | 0 | 0 | 1 | 0 |
| Case 2 | 1 | 0 | 1 | 1 | 0 | 1 |
|  |  | 1 | 0 | 1 | 0 | 0 |

Referring to Table 5, the data line DL may be grounded for discharging of the common node CON. Then, by activating the reset signal RESET_C, the data stored in the third latch LAT3 may be maintained or changed in accordance with the potential of the sensing node SO. That is, when both LSB and MSB data are "0," a potential of the sensing node SO is at a high level, and thus the discharged common node CON may be connected to the flag node QF_N, and the data of the flag node QF may be changed from "1" to "0" when the third reset signal RESET_C is activated.

When the LSB data is "0" and the MSB data is "1," a potential of the sensing node SO may be at a low level, and thus the flag node QF maintains the current data "1" even when the third reset signal RESET_C is activated.

When the LSB data is "1" and the MSB data is "0" a potential of the sensing node SO may be at a high level, and thus the flag node QF may store data of "0." When both the LSB and MSB are "1," a potential of the sensing node SO may be at a low level, and thus the flag node QF may maintain the current data "0" even when the third reset signal RESET_C is activated.

TABLE 6

|  | LSB | MSB | QC (LAT1) | QM (LAT2) | QF (LAT3) | SO |
|---|---|---|---|---|---|---|
| Case 1 | 0 | 0 | 1 | 0 | 0 | 0 |
|  |  | 1 | 0 | 0 | 1 | 0 |

TABLE 6-continued

|  | LSB | MSB | QC (LAT1) | QM (LAT2) | QF (LAT3) | SO |
|---|---|---|---|---|---|---|
| Case 2 | 1 | 0 | 1 | 1 | 0 | 1 |
|  |  | 1 | 0 | 1 | 0 | 0 |

Referring to Table 6, after precharging the sensing node SO by activating the precharge signal PRECH_N, the precharge signal PRECH_N may be deactivated, and the first transmission signal TRAN_A and the second transmission signal' TRAN_B may be activated. Accordingly, if any one of data stored in the cache node QC and main node QM is "0," the sensing node SO may be discharged. In addition, if all of the data stored in the cache node QC and the main node QM are "1," a potential of the sensing node may maintain a high level.

TABLE 7

|  | LSB | MSB | QC (LAT1) | QM (LAT2) | QF (LAT3) | SO |
|---|---|---|---|---|---|---|
| Case 1 | 0 | 0 | 1 | 0 | 0 | 0 |
|  |  | 1 | 0 | 0 | 1 | 0 |
| Case 2 | 1 | 0 | 1 | 1 | 1 | 1 |
|  |  | 1 | 0 | 1 | 0 | 0 |

Referring to Table 7, by activating the third set signal SET_C, data stored in the third latch LAT3 may be maintained or changed in response to the sensing node SO. When a potential of the sensing node SO is at a low level, the discharge circuit 390 may be deactivated such that data stored in the third latch LAT3 may be maintained as it is. When a potential of the sensing node SO is at a high level, the discharge circuit 390 may be activated so that the grounded data line DL may be connected to the common node CON, and thus the common node CON may be discharged. Accordingly, when the third set signal SET_C is activated, the data stored in the third latch LAT3 may be changed from "0" to "1."

As described above with reference to Tables 1 to 7, the third latch LAT3 may store data corresponding to the result of XOR operation on the LSB and MSB data of the neighboring page adjacent to the selected page. The data obtained from the XOR operation and stored in the third latch LAT 3 may be output to the data line DL as the pattern flag data.

The pattern flag data corresponding to the result of XNOR operation may be obtained by inverting the data obtained from the XOR operation on the LSB and MSB data of the neighboring page adjacent of the selected page.

Figure 4:
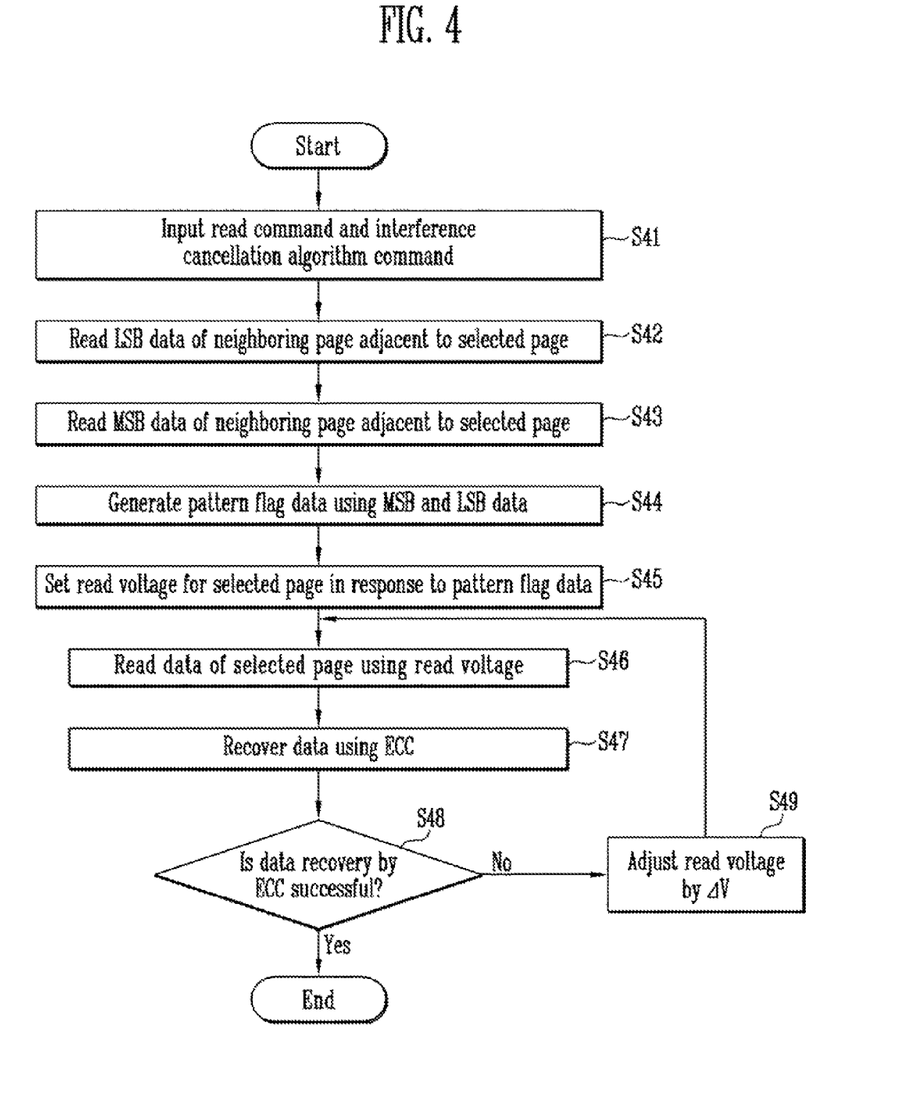
FIG. 4 is a flowchart illustrating an operation of a semiconductor memory device according to an embodiment of the present invention.

FIG. 4 is a flowchart illustrating an operation of semiconductor memory device according to an embodiment of the present invention.

Figure 5:
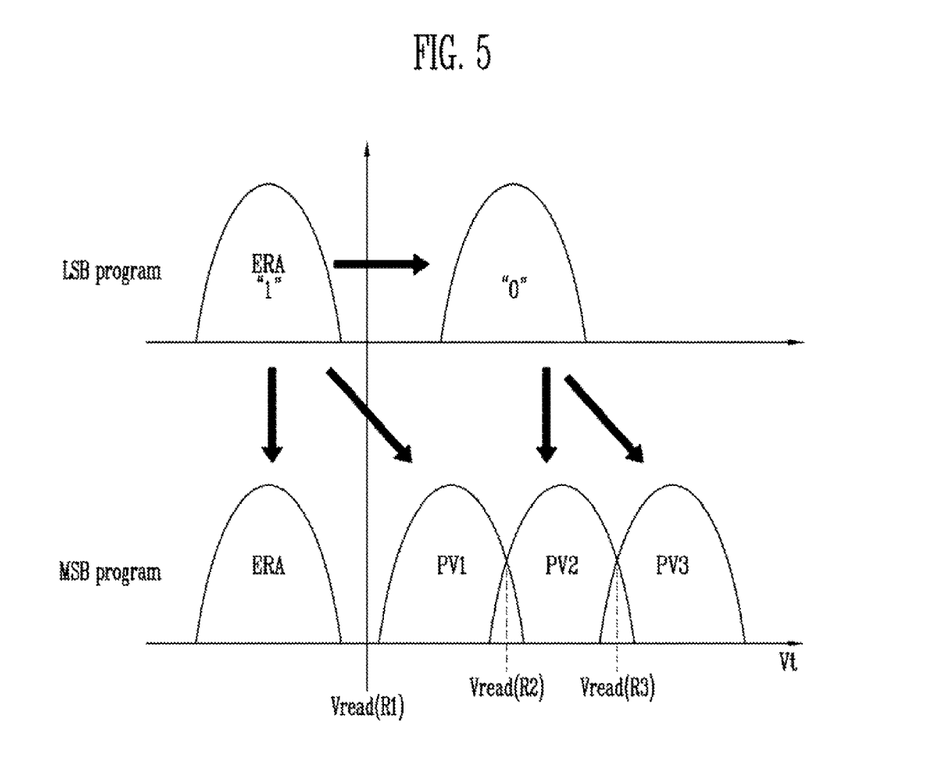
FIG. 5 shows a threshold voltage distribution illustrating an interference amount depending on a programmed state of neighboring memory cells.

FIG. 5 shows a threshold voltage distribution illustrating an interference amount depending on a programmed state of neighboring memory cells.

Referring to FIGS. 1 to 5, a read operation of the semiconductor memory device according to the embodiment of the present invention will be described as follows.

1. Input Read Command and Interference Cancellation Algorithm Command (S41)

If a read command and an interference cancellation algorithm command are input from the host, the controller 200 may transmit a command CMD according to the read command and the interference cancellation algorithm command to the semiconductor memory device 100.

2. Read the LSB Data of the Neighboring Page Adjacent to the Selected Page (S42)

The control logic 140 may control such that the voltage generator 150 may output the read voltage Vread and the pass voltage Vpass, and the address decoder 120 may apply the read voltage Vread to the neighboring page adjacent to the selected page. In addition, the control logic 140 may control such that the page buffers PB1 to PBm of the read/write circuit 130 may read the LSB data of the neighboring page adjacent to the selected page, and temporarily store the LSB data.

3. Read the MSB Data of the Neighboring Page Adjacent to the Selected Page (S43)

The control logic 140 may control such that the voltage generator 150 may output the read voltage Vread and the pass voltage Vpass, and the address decoder 120 may apply the read voltage Vread to the neighboring page adjacent to the selected page. In addition, the control logic 140 may control such that the page buffers PB1 to PBm of the read/write circuit 130 may read the MSB data of the neighboring page adjacent to the selected page, and temporarily store the MSB data.

4. Generate the Pattern Flag Data Using the MSB and LSB Data (S44)

The control logic 140 may perform a logical operation on the MSB and LSB data temporarily stored in the page buffers PB1 to PBm to generate the pattern flag data, and control the page buffers PB1 to PBm to output the generated pattern flag data to the controller 200.

5. Set Read Voltage for the Selected Page in Response to the Pattern Flag Data (S45)

The controller 200 may set a read voltage Vread for the selected page in response to the pattern flag data.

Referring to FIG. 5, during program operation of a semiconductor memory device having a multi-level cell, MSB program operation may be performed after LSB program operation. In this case, a programmed memory cell may have an increased threshold voltage due to interference by a program voltage when program operation performed on the neighboring memory cells. Thus, threshold voltage distributions may overlap at a second read voltage Vread (R2) and a third read voltage Vread (R3).

In addition, when program operation is performed by transitioning both from an erase state (ERA, "1") to a first program state (PV1) and from "0" to a third program state (PV3), the threshold voltage of the memory cell may change at its maximum, so that the program operation results in significant interference to the neighboring memory cells. On the other hand, when program operations are performed by transitioning both from the erase state (ERA, "1") to an erase state (ERA) and from "0" to a second program state (PV2), the threshold voltage of the memory cell may change comparatively little such that the program operation may result in minimal interference to the neighboring memory cells. In this case, the states ERA, PV1, PV2, and PV3 may correspond to data of "11," "01," "00," and "10," respectively.

Accordingly, it is possible to predict a variation in threshold voltage caused by the interference in the selected memory cell in accordance with the program state of the neighboring memory cell that may be adjacent to the selected memory cell in a direction of the word line and may be programmed after programming of the selected memory cell during the program operation.

For example, when the pattern flag data is generated by XOR operation on the LSB and MSB data of the neighboring page, the pattern flag data of the neighboring memory cells of the first and third program states PV1 and PV3, in which the interference may be relatively high, may be "1," while that of the neighboring memory cells of the erase and the second program states ERA and PV2, in which interference may be relatively low, may be "0."

Accordingly, when the read voltage Vread for the selected page is set based on the pattern flag data, the controller 200 may increase or maintain the read voltage Vread based on the pattern flag data. In addition, when the read voltage Vread is increased and set an amount of potential may be adjusted based on the pattern flag data.

6. Read Data of the Selected Page Using the Read Voltage for the Selected Page (S46)

The controller 200 may output a read voltage adjustment command CTRL indicating the read voltage Vread for the selected page, which may be set based on the pattern flag data, to the control logic 140, and the control logic 140 may adjust a potential level of the read voltage Vread, which may be generated in the voltage generator 150, in response to the read voltage adjustment command CTRL.

The control logic 140 controls such that the page buffers PB1 to PBm of the read/write circuit 130 read the LSB of the selected page, and output the read LSB to the controller 200.

7. Recover Data Using Error Correction Code (ECC) (S47)

The controller 200 may perform a recovery operation on the read data using an error correction block 210.

8. Determine ECC Processed Result (S48)

As a result of ECC processed data, when there is "error-free data" or "data that is correctable despite occurrence of errors," the controller 200 may output data as final read data after correcting errors.

9. Adjust the Read Voltage for the Selected Page (S49)

As a result of ECC processed data, when the amount of faulty data is larger than an allowable value, the controller 200 may adjust the read voltage Vread for the selected page by ΔV, and repeat the steps S46 to S49. In this case, when a number of repetitions are larger than the allowable number of repetitions, the read operation may be processed as having failed.

As described above, according to embodiments of the present invention, when the read operation is performed, correct data may be read out by setting the read voltage used during the read operation of the selected memory cells by reading the MSB and LSB data of the neighboring memory cells. In addition, when the read operation of data is performed on the neighboring memory cells, the readout data may be transformed into the pattern flag data, which may reduce data amounts, so that a data output operation may be simplified.

Figure 6:
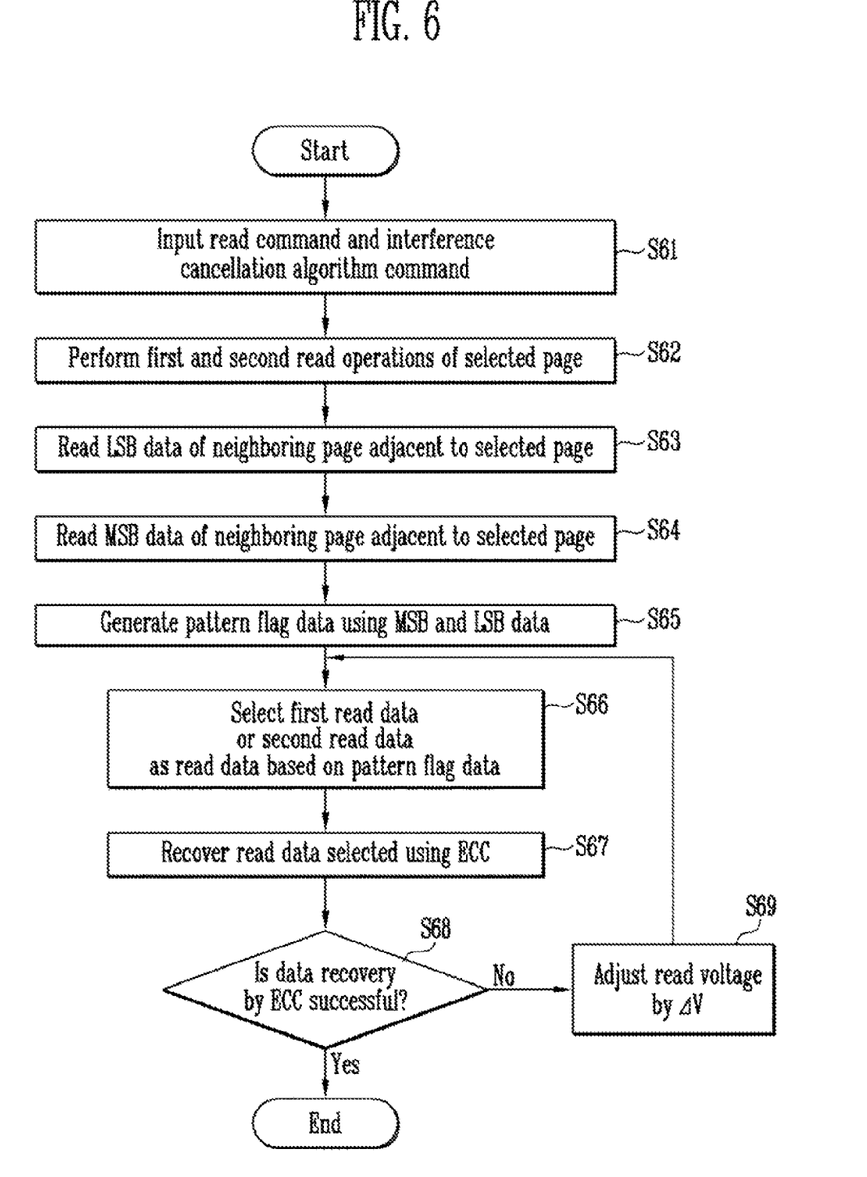
FIG. 6 is a flowchart illustrating an operation of semiconductor memory device according to another embodiment of the present invention.

FIG. 6 is a flowchart illustrating an operation of a semiconductor memory device according to another exemplary embodiment of the present invention.

Referring to FIGS. 1 to 3, 5 and 6, the read operation according to the exemplary embodiments of the present invention will be described as follows.

1. Input Read Command and Interference Cancellation Algorithm Command (S61)

If a read command and an interference cancellation algorithm command may be input from the host, the controller 200 may transmit a command CMD according to the read command and the interference cancellation algorithm command to the semiconductor memory device 100.

2. Perform First and Second Read Operations of the Selected Page (S62)

The controller 200 may control the semiconductor memory device 100 to perform a first read operation using the read voltage Vread and a second read operation using a compensated read voltage having a larger level than the read voltage Vread by ΔV. In this way, the semiconductor memory device 100 may transmit first read data according to the first read operation and second read data according to the second read operation to the controller 200.

3. Read the LSB Data of the Neighboring Page Adjacent to the Selected Page (S63)

The control logic 140 may control such that the voltage generator 150 may output the read voltage Vread and the pass voltage Vpass, and the address decoder 120 may apply the read voltage Vread to the neighboring page adjacent to the selected page. In addition, the control logic 140 may control such that the page buffers PB1 to PBm of the read/write circuit 130 may read the LSB data of the neighboring page adjacent to the selected page, and temporarily store the LSB data.

4. Read the MSB Data of the Neighboring Page Adjacent to the Selected Page (S64)

The control logic 140 may control such that the voltage generator 150 may output the read voltage Vread and the pass voltage Vpass, and the address decoder 120 may apply the read voltage Vread to the neighboring page adjacent to the selected page. In addition, the control logic 140 may control such that the page buffers PB1 to PBm of the read/write circuit 130 may read the MSB data of the neighboring page adjacent to the selected page, and temporarily store the MSB data.

5. Generate the Pattern Flag Data Using the MSB and LSB Data (S65)

The control logic 140 may perform a logical operation on the MSB and LSB data temporarily stored in the page buffers PB1 to PBm to generate the pattern flag data, and control the page buffers PB1 to PBm to output the generated pattern flag data to the controller 200.

6. Select the First Read Data or the Second Read Data as the Read Data Based on the Pattern Flag Data (S66)

The controller 200 may select as the read data one of the first read data and the second read data respectively according to the first read operation and the second read operation in response to the pattern flag data.

In this case, accuracy of data may be improved by selecting the read data based on the pattern flag data. That is, the improvement on accuracy of data may be made by predicting a variation in threshold voltage of the selected memory cell through the pattern flag data during the program operation on the neighboring memory cell, and by selecting as the read data one of the first read data, which may be read using the read voltage Vread, and the second read data, which may be read using the compensated read voltage having a larger level than the read voltage by ΔV, through the predicted variation.

7. Recover Data Using ECC (S67)

The controller 200 may perform a recovery operation of the read data using the error correction block 210.

8. Determine ECC Processed Result (S68)

As a result of ECC processed data, when there is "error-free data" or "data that is correctable despite occurrence of errors," the controller 200 may output the data as final read data after correcting errors.

9. Adjust the Read Voltage for the Selected Page (S69)

As a result of ECC processed data, when the amount of faulty data may be larger than an allowable value, the controller 200 may adjust the read voltage Vread for the selected page by ΔV, and repeat the steps S66 to S69. In this case, when the count number of repetitions is larger than the allowable number of repetitions, the read operation may be processed as having failed.

Figure 7:
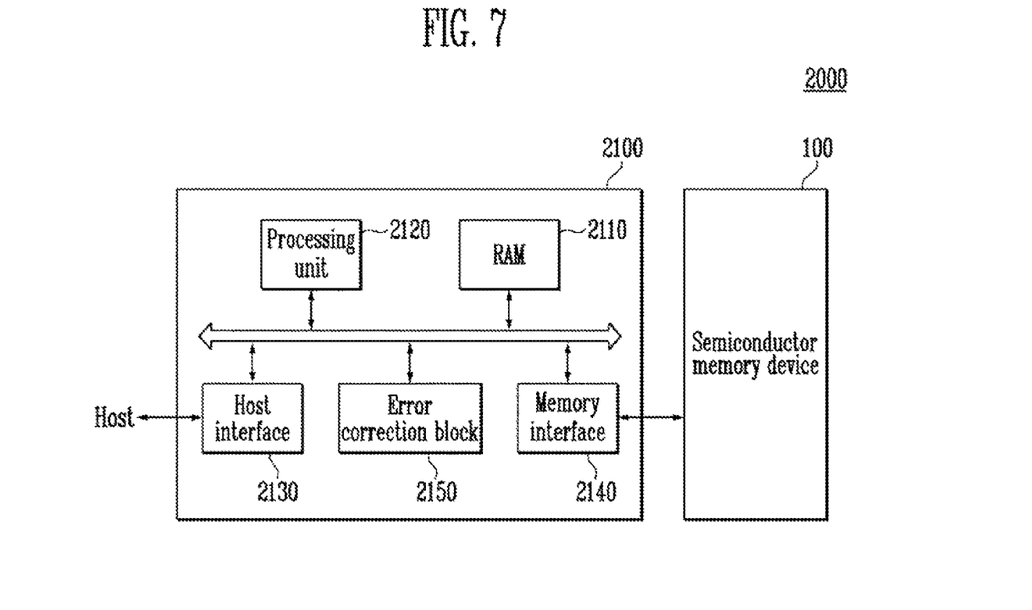
FIG. 7 is a block diagram illustrating a memory system including the semiconductor memory device shown in FIG. 1.

FIG. 7 is a block diagram illustrating a memory system including the semiconductor memory device of shown in FIG. 1.

Referring to FIG. 7, a memory system 2000 may include a semiconductor memory device 100 and a controller 2100.

The semiconductor memory device 100 may be configured and operated in the same way as described with reference to FIG. 1.

The controller 2100 may include a function of the controller 200 described with reference to FIG. 1. The controller 2100 may be connected to a host Host and the semiconductor memory device 100. The controller 2100 may access the semiconductor memory device 100 in response to a request from the host Host. For example, the controller 2100 may control write, read, erase and background operations of the semiconductor memory device 100. The controller 2100 may provide an interface between the semiconductor memory device 100 and the host Host. The controller 2100 may drive firmware for controlling the semiconductor memory device 100.

The controller 2100 may include a random access memory (RAM) 2110, a processing unit 2120, a host interface 2130, a memory interface 2140, and an error correction block 2150. The RAM 2110 is used as at least one out of an operation memory of the processing unit 2120, a cache memory between the semiconductor memory device 100 and the host Host, and a buffer memory between the semiconductor memory device 100 and the host Host. The processing unit 2120 controls all the related operations of the controller 2100. In addition, the controller 2100 may temporarily store program data provided from the host Host when a write operation is performed.

The host interface 2130 may include a protocol to perform data exchange between the host Host and the controller 2100. As an exemplary embodiment, the controller 1200 may communicate with the host Host through at least one of various interface protocols such as a Universal Serial Bus (USB) protocol, a MultiMediaCard (MMC) protocol, a Peripheral Component Interconnect (PCI) protocol, a PCI-Express (PCI-E) protocol, are Advanced Technology Attachment (ATA) protocol, a Serial-ATA protocol a Parallel-ATA protocol, a Small Computer System Interface (SCSI) protocol, an Enhanced Small Disk Interface (ESDI) protocol, an Integrated Drive Electronics (IDE) protocol, and a private protocol.

The memory interface 2140 interfaces with the semiconductor memory device 100. For example, the memory interface 2140 may include a NAND interface or NOR interface.

The error correction block 2150 performs the same function as the error correction block 210 of FIG. 1. The error correction block 2150 may detect and correct errors in data received from the semiconductor memory device 100 using ECC. The processing unit 2120 controls the semiconductor memory device 100 such that a read voltage is adjusted to perform a re-read operation based on an error detection result of the error correction block 2150. As an exemplary embodiment, the controller 2100 may include the error correction block 2150.

The controller 2100 and the semiconductor memory device 100 may be integrated into one semiconductor device. As an exemplary embodiment, the controller 2100 and the semiconductor memory device 100 may be integrated into one semiconductor device to form a memory card. For example, the controller 2100 and the semiconductor memory device 100 may be integrated into one semiconductor device to form a memory card such as a PC Card (Personal Computer Memory Card International Association (PCMCIA) card), a Compact-Flash (CF) card, a SmartMedia card (SM, SMC), a Memory Stick, an MMC (MMC, RS-MMC, MMCmicro), an SD card (SD, miniSD, microSD, SDHC) a Universal Flash Storage (UFS), etc.

The controller 2100 and the semiconductor memory device 100 may be integrated into one semiconductor device to form a solid state drive (SSD). The SSD may include a storage device configured to store data in the semiconductor memory. When the memory system 2000 is used as the SSD operation speed of the host Host connected to the memory system 2000 may be dramatically improved.

As another example, the memory system 1000 may be provided as one of components of electronic devices such as a computer, an ultra-mobile PC (UMPC), a workstation, a net-book, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, a device capable of sending/receiving information under a wireless environment, one of a variety of electronic devices configuring a home network, one of a variety of electronic devices configuring a computer network, one of a variety of electronic devices configuring a telematics network, an RFID device, or one of various components configuring a computing system As an exemplary embodiment, the semiconductor memory device 100 or the memory system 2000 may be mounted in various forms of packages. For example, the semiconductor memory device 100 or the memory system 2000 may be mounted and packaged in a type such as a package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIL), shrink small outline package (SSOP), thin small outline package (TSOP), thin quad flat pack (TQFP), system in package (SIP), multi-chip package (MCP), wafer-level fabricated package (WFP), or wafer-level processed stack package (WSP) type.

Figure 8:
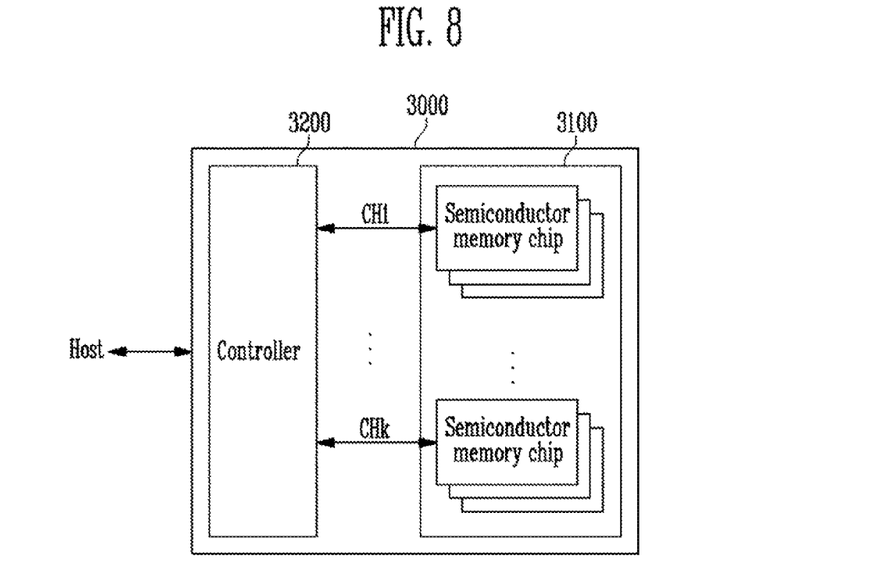
FIG. 8 is a block diagram illustrating an application example of the memory system shown in FIG. 7.

FIG. 8 is a block diagram illustrating an application example 3000 of the memory system 2000 shown in FIG. 7.

Referring to FIG. 8 the memory system 3000 may include a semiconductor memory device 3100 and a controller 3200. The semiconductor memory device 3100 may include a plurality of semiconductor memory chips. The plurality of semiconductor memory chips may be divided into a plurality of groups.

In FIG. 8, each of the plurality of groups is illustrated as communicating with the controller 3200 through first to $k^{th}$ channels CH1 to CHk. Each of the semiconductor memory chips may operate in the same way as the semiconductor device 100 illustrated with reference to FIG. 1.

Each group may communicate with the controller 3200 through one common channel. The controller 3200 may be configured the same as the controller 2100 illustrated with reference to FIG. 8, and configured to control the plurality of memory chips of the semiconductor memory device 3100 through the plurality of channels CH1 to CHk.

In FIG. 8, one channel is described as being connected to the plurality of memory chips. However, it may be understood that the memory system 3000 is transformed such that one semiconductor memory chip is connected to one channel.

Figure 9:
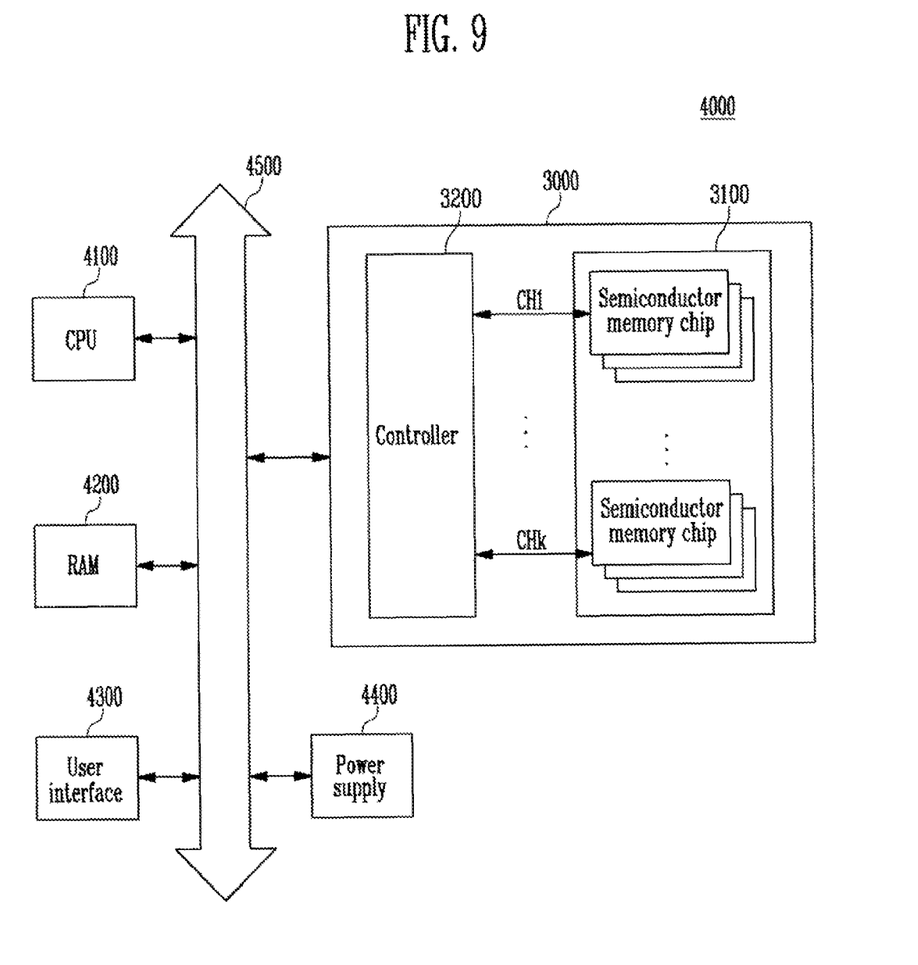
FIG. 9 is a block diagram illustrating a computing system including the memory system shown in FIG. 8.

FIG. 9 is a block diagram illustrating a computing system 4000 including the memory system 3000 shown in FIG. 8.

Referring to FIG. 9, the computing system 400 may include a central processing unit 4100, a RAM 4200, a user interface 4300, a power supply 4400, a system bus 4500, and a memory system 3000.

The memory system 3000 is electrically connected to the central processing unit 4100, the RAM 4200, the user interface 4300, and the power supply 4400 through the system bus 4500. Data provided through the user interface 4300 or processed by the central processing unit (CPU) 4100 is stored in the memory system 3000.

In FIG. 9, the semiconductor 3100 is illustrated as being connected to the system bus 4500 through the controller 3200. However, the semiconductor memory device 3100 may be directly connected to the system bus 4500. In this case, the central processing unit 4100 and the RAM 4200 may perform a function of the controller 3200.

The memory system 3000 illustrated with reference to FIG. 8 is provided in FIG. 9. However, the memory system 3000 may be replaced with the memory system 2000 illustrated with reference to FIG. 7. As an exemplary embodiment, the computing system 4000 may include both the memory systems 2000 and 3000 illustrated with reference to FIGS. 8 and 7.

According to embodiments of the present invention, when a read operation is performed, correct data may be read out by reading data of neighboring memory cells and controlling a read operation of a selected memory cell.

Data read out during a read operation of data of the neighboring memory cells may be converted into pattern flag data to reduce an amount of data, thereby simplifying an output operation of data.

It will be apparent to those skilled in the art that various modifications may be made to the above-described embodiments of the present invention without departing from the spirit or scope of the present invention. Thus, it is intended that the present invention covers all such modifications provided they come within the scope of the appended claims and their equivalents.

What is claimed is:

1. A semiconductor memory device, comprising:
a memory cell array including a plurality of memory cells;
a peripheral circuit configured to read least significant bit data and most significant bit data of neighboring memory cells adjacent to selected memory cells out of the plurality of memory cells, and generate pattern flag data using the least significant bit data and the most significant bit data; and
a control logic configured to select and output one of a plurality of temporarily stored read data according to the pattern flag data,
wherein the neighboring memory cells are included in neighboring memory pages adjacent to a page of the selected memory cells.

2. The semiconductor memory device according to claim 1, wherein the peripheral circuit includes:
a voltage generator configured to generate the read voltage; and
a plurality of page buffers suitable for reading the least significant bit data and the most significant bit data to generate the pattern flag data based on the least significant bit data and the most significant bit data and to read data stored in the selected memory cells.

3. The semiconductor memory device according to claim 2, wherein the page buffers temporarily store the least significant bit data and the most significant bit data, and perform an XOR or XNOR operation on the least significant bit data and the most significant bit data that are temporarily stored to generate the pattern flag data.

4. The semiconductor memory device according to claim 1, wherein the pattern flag data has a data amount less than the summed amount of the least significant bit data and the most significant bit data.

5. The semiconductor memory device according to claim 1, wherein the pattern flag data indicates an interference effect on the selected memory cells from the neighboring memory cells.

6. A memory system comprising:
a semiconductor memory device configured to output pattern flag data based on least significant data and most significant data of neighboring memory cells adjacent to selected memory cells and output stored data as read data during a read operation; and
a controller configured to control the semiconductor memory device to set a read voltage in response to the pattern flag data to read the read data, perform error correction code (ECC) on the read data, and re-perform the read operation by re-setting the read voltage when data recovery fails as a result of the ECC,
wherein the neighboring memory cells are included in neighboring memory pages adjacent to a page of the selected memory cells.

7. The memory system according to claim 6,
wherein the semiconductor memory cell includes:
a memory cell array including a plurality of memory cells;
a peripheral circuit configured to read the least significant bit data and the most significant bit data, and generate the pattern flag data; and
a control logic configured to control the peripheral circuit to set the read voltage to be applied to the selected memory cells according to control of the controller.

8. The memory system according to claim 7,
wherein the controller controls the control logic so that the control logic controls the peripheral circuit to set the read voltage based on the pattern flag data by predicting interference that the selected memory cells experience due to the neighboring memory cells.

9. The memory system according to claim 7,
wherein the peripheral circuit includes:
a voltage generator configured to generate the read voltage; and
a plurality of page buffers configured to read the least significant data and the most significant data to generate the pattern flag data and to read data stored in the selected memory cells.

10. The memory system according to claim 9,
wherein the page buffers temporarily store the least significant bit data and the most significant bit data, and perform an XOR or XNOR operation on the least significant bit data and the most significant bit data that are temporarily stored to generate the pattern flag data.

11. The memory system according to claim 6,
wherein the pattern flag data has a data amount less than the summed amount of the least significant bit data and the most significant bit data.

12. The memory system according to claim 6,
wherein the pattern flag data indicates an interference effect on the selected memory cells from the neighboring memory cells.

13. The memory system according to claim 9,
wherein the control logic controls such that the voltage generator outputs the read voltage in response to the pattern flag data, and an adjusted read voltage for the selected memory cells having higher voltage level than the read voltage.

14. A method of operating a semiconductor memory device, comprising:
performing a first read operation and a second read operation on selected memory cells, among a plurality of memory cells;
reading least significant bit data and most significant bit data of neighboring memory cells that are adjacent to a selected memory cell, wherein the neighboring memory cells are included in neighboring memory pages adjacent to a page of the selected memory cells;
generating pattern flag data using the least significant bit data and the most significant bit data; and
selecting and outputting first read data read during the first read operation or second read data read during the second read operation as read data according to the pattern flag data.

15. The method according to claim 14,
wherein the pattern flag data is generated by performing an XOR or XNOR operation on the least significant bit data and the most significant bit data.

16. The method according to claim 14,
wherein the pattern flag data has a data amount less than the summed amount of the least significant bit data and the most significant bit data.

* * * * *